United States Patent
Clark et al.

(10) Patent No.: US 8,055,494 B1
(45) Date of Patent: Nov. 8, 2011

(54) REPORTING DELAY IN MODELING ENVIRONMENTS

(75) Inventors: Martin Clark, Boston, MA (US); Michael H. McLernon, Attleboro, MA (US)

(73) Assignee: The MathWorks, Inc., Natick, MA (US)

( * ) Notice: Subject to any disclaimer, the term of this patent is extended or adjusted under 35 U.S.C. 154(b) by 221 days.

(21) Appl. No.: 12/475,802

(22) Filed: Jun. 1, 2009

Related U.S. Application Data

(63) Continuation of application No. 10/853,816, filed on May 25, 2004, now Pat. No. 7,542,892.

(51) Int. Cl.
*G06F 17/50* (2006.01)
(52) U.S. Cl. ............................................. 703/19; 703/13
(58) Field of Classification Search .................... 703/13, 703/19
See application file for complete search history.

(56) References Cited

U.S. PATENT DOCUMENTS

| | | | |
|---|---|---|---|
| 4,667,240 A * | 5/1987 | Willis et al. | 348/620 |
| 6,311,147 B1 | 10/2001 | Tuan et al. | |
| 7,219,048 B1 | 5/2007 | Xu | |
| 2004/0208193 A1 * | 10/2004 | Orofino et al. | 370/442 |

OTHER PUBLICATIONS

Lee, James M., Verilog® Quickstart, 3rd Edition, A Practical Guide to Simulation and Synthesis in Verilog, pp. 55, 338 (2002).
The Math Works, Simulink® Model-Based and System-Based Design, Using Simulink, Version 4, (2001).

* cited by examiner

*Primary Examiner* — Paul Rodriguez
*Assistant Examiner* — Eun Kim
(74) *Attorney, Agent, or Firm* — Nelson Mullins Riley & Scarborough LLP

(57) ABSTRACT

Methods and systems for automatically reporting delay incurred in a model is disclosed. The delay may be incurred in a part or in an entire portion of the model. Delay incurred in each component of the model is determined and reported to users before executing the model. The delay of each component of the model may be determined based on intrinsic information of the component. If the intrinsic information of the component does not provide information on the delay of the component, the component may be simulated to determine the delay of the components. The model may be automatically compensated for the delay. The delay is reported prior to the execution of the model, and compensated for without executing the model.

20 Claims, 13 Drawing Sheets

| Block | Framing and Timing at Block Output |
|---|---|
| Bernoulli Binary Source | 10 \| 10 |
| Buffer Up | [15] \| 15 |
| Buffer Down | 10 \| 10 |

*Fig. 10B*

| Block | Framing and Timing at Block Output |
|---|---|
| Bernoulli Binary Source | 10 \| 10 |
| Buffer Up | [15] \| 15 |
| Buffer Down | [5] \| 10 \| 10 |

*Fig. 10D*

REPORTING DELAY IN MODELING ENVIRONMENTS

RELATED APPLICATIONS

This application is a continuation of, and claims priority to, U.S. application Ser. No. 10/853,816 now U.S. Pat. No. 7,542,892, filed on May 25, 2004 and issued on Jun. 2, 2009, the disclosure of which is hereby incorporated by reference in its entirety.

FIELD OF THE INVENTION

The present invention relates generally to modeling environments and more particularly to methods and systems for automatically reporting and compensating for delay incurred in a model in the modeling environments.

BACKGROUND OF THE INVENTION

Various classes of block diagrams describe computations that can be performed on application specific computational hardware, such as a computer, microcontroller, FPGA, and custom hardware. Classes of such block diagrams include time-based block diagrams such as those found within Simulink® from The MathWorks, Inc. of Natick, Mass., state-based and flow diagrams such as those found within Stateflow® from The MathWorks, Inc. of Natick, Mass., and dataflow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages such as Simulink®. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of block diagram models in the development, analysis, and validation of dynamic systems.

For many systems, the knowledge of end-to-end delay is crucially important in designing models of the systems in the block diagram modeling environments. In a computer communication system, for example, packet delay is one of the fundamental performance measures that indicate the quality and robustness of the models designed for the computer communication system. For another example, in a manufacturing system, knowing the delivery delay of a critical part determines the time at which the part should be ordered in the models for the manufacturing system. Therefore, it is desired to provide information on the delay incurred in the models so that users may compensate for the delay.

SUMMARY OF THE INVENTION

The present invention provides methods and systems for automatically reporting and compensating for delay in a modeling environment. The present invention may report and compensate for the delay incurred in a portion of a model or in an entire model. The present invention may determine and report the delay incurred in each component of the model before executing the model. The delay of each component may be determined based on intrinsic information of the component. If the intrinsic information of the component does not provide information on the delay incurred in the component, the component may be simulated to determine the delay of the component. In the present invention, the delay may be represented in terms of various quantities, such as time, samples and frames. The present invention may be applied to systems that deal with signals, including sample-based signals, frame-based signals, bus signals, multi-rate signals, and multi-dimensional signals.

In one aspect of the present invention, a method is provided for reporting algorithmic delay incurred in a model. The model is edited to include components in the model. In response to user's selection of components in the model, the algorithmic delay of the selected components of the model is determined. The algorithmic delay of the selected components is reported to the user prior to executing the model.

In another aspect of the present invention, a method is provided for reporting delay in a modeling environment. A user interface element is displayed with a list of component names that identify components in a model. The user interface element is provided with graphical elements in connection with the list of component names. Each of the graphical elements includes information on an amount of delay incurred in the corresponding components of the model.

In still another aspect of the present invention, a method is provided for compensating for algorithmic delay incurred in a model. The algorithmic delay incurred in the model is reported prior to the execution of the model. A compensation component is inserted in the model to compensate for the algorithmic delay incurred in the model. The model is executed after compensating for the delay.

The present invention provides users with information on the delay incurred in a model before executing the model in a modeling environment. By reporting delay information of the model before executing the model, the present invention enables the users to compensate for the delay without executing the model in the modeling environment.

BRIEF DESCRIPTION OF THE DRAWINGS

The aforementioned features and advantages, and other features and aspects of the present invention, will become better understood with regard to the following description and accompanying drawings, wherein:

FIG. 10B depicts an exemplary frame timing diagram of the model without compensation;

FIG. 10D depicts an exemplary frame timing diagram of the model with delay compensation.

DETAILED DESCRIPTION

Figure 1:
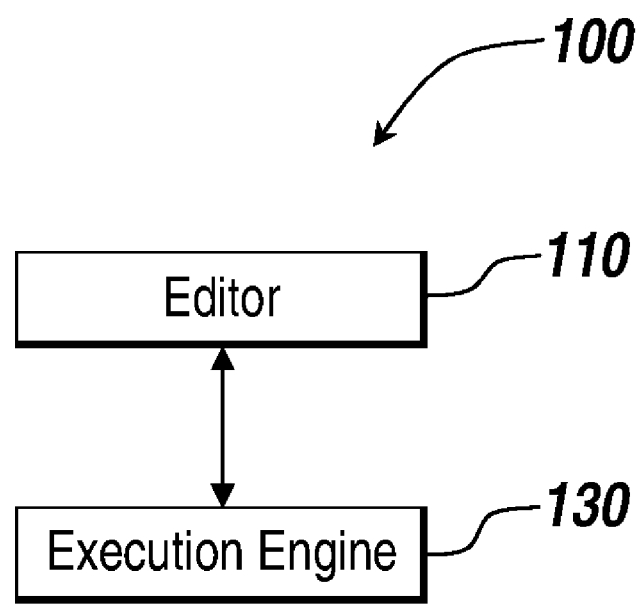
FIG. 1 shows an exemplary block diagram modeling environment in the illustrative embodiment of the present invention.

The illustrative embodiment of the present invention concerns automatically reporting delay incurred in a model. The illustrative embodiment will be described solely for illustrative purposes relative to a model implemented in a block diagram modeling environment. Although the illustrative embodiment will be described relative to a model implemented in the block diagram modeling environment, one of skill in the art will appreciate that the present invention may apply to models implemented in other modeling environments including textual modeling environments, such as command line modeling environments, and different graphical modeling environments, such as state-based and flow diagram modeling environments and data flow modeling environments.

"Block diagram" will be used hereinafter as described above in the Background of the Invention.

In the illustrative embodiment of the present invention, the delay refers to algorithmic delay. The algorithmic delay is delay that is intrinsic to the algorithm of blocks in the block diagram modeling environment, and is independent of hardware speed. The algorithmic delay of a particular block may depend on both the block's parameter settings and the general settings of the block diagram modeling environment. The delay is generally expressed in terms of the number of samples by which the block's outputs lag behind the corresponding inputs of the blocks. The delay may also be represented in terms of other quantities, such as the number of frames and time lag between the inputs and outputs of the blocks in the block diagram modeling environment. A frame is referred to as a quantity that includes multiple samples in the description of the illustrative embodiment of the present invention. The samples in a frame represent a serial stream of data over a user-defined time period, even though all the samples in a frame are transmitted or received simultaneously.

The reporting of the algorithmic delay is illustrative and does not limit the scope of the present invention. One of skill in the art will appreciate that the present invention may be extended and applied to reporting other types of delay, such as execution or computational delay that relates to the number of operations involved in the execution of the blocks in the model. The execution or computational delay may depend on the performance of both the hardware and underlying software layers.

An exemplary block diagram modeling environment may be found in Simulink® from The MathWorks, Inc. The illustrative embodiment will be described relative to a model implemented in Simulink®. Nevertheless, those who are skilled in the art will appreciate that the present invention may be practiced relative to models implemented in other block diagram modeling environments, including but not limited to LabVIEW from National Instruments Corporation of Austin, Tex.

Simulink® provides tools for modeling and simulating a variety of dynamic systems in one integrated, graphical environment. Simulink® enables users to design a block diagram for a target system, simulate the system's behavior, analyze the performance of the system, and refine the design of the system. Simulink® allows users to design target systems through a user interface that allows drafting of block diagram models of the target systems. All of the blocks in a block library provided by Simulink and other programs are available to users when the users are building the block diagram of the target systems. Individual users may be able to customize this model block to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). Simulink® includes a block diagram editor that allows users to perform such actions as draw, edit, annotate, save, and print out block diagram representations of target systems. The block diagram editor is a graphical user interface (GUI) component that allows drafting of block diagram models by users. In Simulink®, there is also a textual interface with a set of commands that allow interaction with the graphical editor, such as the textual interface provided in MATLAB®. Using this textual interface, users may write special scripts that perform automatic editing operations on the block diagram. Simulink® also allows users to simulate the designed target systems to determine the behavior of the systems. Simulink® includes a block diagram execution engine 130 that carries out the task of compiling and linking the block diagram to produce an "in-memory executable" version of the model that is used for generating code and/or simulating a block diagram model.

Simulink® has the ability to simulate discrete (sampled data) systems, including systems whose components operate at different rates (multirate systems) and systems that mix discrete and continuous components (hybrid systems). Some Simulink® blocks have a SampleTime parameter that specifies the block's sample time, i.e., the rate at which it executes during simulation. All blocks have either an explicit or implicit sample time parameter. Continuous blocks are examples of blocks that have an implicit (continuous) sample time. It is possible for a block to have multiple sample times. Most standard Simulink® blocks can inherit their sample time from the blocks connected to their inputs. Exceptions may include blocks that do not have inputs, such as source blocks. In some cases, source blocks can inherit the sample time of the block connected to its input. The ability to specify sample times on a block-by-block basis, either directly through the SampleTime parameter or indirectly through inheritance, enables users to model systems containing discrete components operating at different rates and hybrid systems containing discrete and continuous components.

FIG. 1 shows an exemplary block diagram modeling environment 100, such as Simulink®, in the illustrative embodiment of the present invention. The block diagram modeling environment 100 includes a block diagram editor 110 and a block diagram execution engine 130. The editor 110 allows users to perform such actions as draw, edit, annotate, save, and print out block diagram representations of systems. The block diagram editor 110 is a graphical user interface (GUI) component that allows drafting of block diagram models by the users. Methods used in editing are called by the block diagram editor 110 in order to render the block appropriately in the GUI of its parent block diagram. For instance, this set of methods may include a BlockDrawIcon method that determines the shape the block icon has on the GUI. The block diagram editor 110 may allow users to specify the parameters for the block when they use it in their models. In Simulink®, there is also a textual interface with a set of commands that allow interaction with the graphical editor 110. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of subsystems. An exemplary model generated using the editor 110 will be described below with reference to FIG. 4.

The block diagram execution engine 130 contributes to the modeling software task of enabling the computation and tracing of a dynamic system's outputs from its block diagram model. The execution engine 130 carries out the task of compiling and linking the block diagram to produce an "in-memory executable" version of the model that is used for generating code and/or simulating or linearizing a block diagram model. The execution of the block-diagram may also be referred to as simulation.

The compilation stage involves preparing data structures and evaluating parameters, configuring and propagating block characteristics, determining block connectivity, and performing block reduction and block insertion. The preparation of data structures and the evaluation of parameters create and initialize basic data-structures needed in the compile stage. For each of the blocks, a method forces the block to evaluate all of its parameters. This method is called for all blocks in the block diagram. If there are any unresolved parameters, execution errors are thrown at this point. During the configuration and propagation of block and port/signal characteristics, the compiled attributes (such as dimensions, data types, complexity, or sample time) of each block (and/or ports) are set up on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. Secondly, in many cases blocks are implemented to be compatible with a wide range of attributes. Such blocks adapt their behavior in accordance with the attributes of the blocks connected to them. This is akin to the concept of polymorphism in object-oriented programming languages. The exact implementation of the block is chosen on the basis of the specific block diagram in which this block finds itself. Included within this step are other aspects such as validating that all rate transitions within the model yield deterministic results and that the appropriate Rate Transition blocks are being used. The compilation step also determines actual block connectivity. Virtual blocks, such as input ports and output ports, play no semantic role in the execution of a block diagram. In this step, the virtual blocks in the block diagram are optimized away (removed) and the remaining non-virtual blocks are reconnected to each other appropriately. This compiled version of the block diagram with actual block connections is used from this point forward in the execution process. The way in which blocks are interconnected in the block diagram does not necessarily define the order in which the equations (methods) corresponding to the individual blocks will be solved (executed). The actual order is partially determined during the sorting step in compilation.

In the link stage, the execution engine 130 uses the result of the compiled stage to allocate memory needed for the execution of the various components of the block diagram. The linking stage also produces block method execution lists which are used by the simulation or linearization of the block diagram. Included within the link stage is the initialization of the model which consists of evaluating "setup" methods (e.g. block start, initialize, enable, and constant output methods). The block method execution lists are generated because the simulation and/or linearization of a model must execute block methods by type (not by block) when they have a sample hit. After linking has been performed, the execution engine 130 may generate code. In this stage, the execution engine 130 may choose to translate the block diagram model (or portions of it) into either software modules or hardware descriptions (broadly termed code). If this stage is performed, then the stages that follow use the generated code during the execution of the block diagram. If this stage is skipped completely, then the execution engine 130 uses an interpretive mode of execution for the block diagram. In some cases, the user may not proceed further with the execution of the block diagram because they would like to deploy the code outside the confines of the block diagram software. Upon reaching the simulation stage, the execution engine 130 uses a simulation loop to execute block methods in a pre-defined ordering upon a sample hit to produce the system responses they change with time. For linearization, Simulink® uses the block method execution lists in a prescribed fashion to produce a linear state space representation of the dynamic system described by the block diagram. The operation of the present invention using the editor 110 and execution engine 130 will be described in more detail with reference to FIG. 3.

Figure 2:
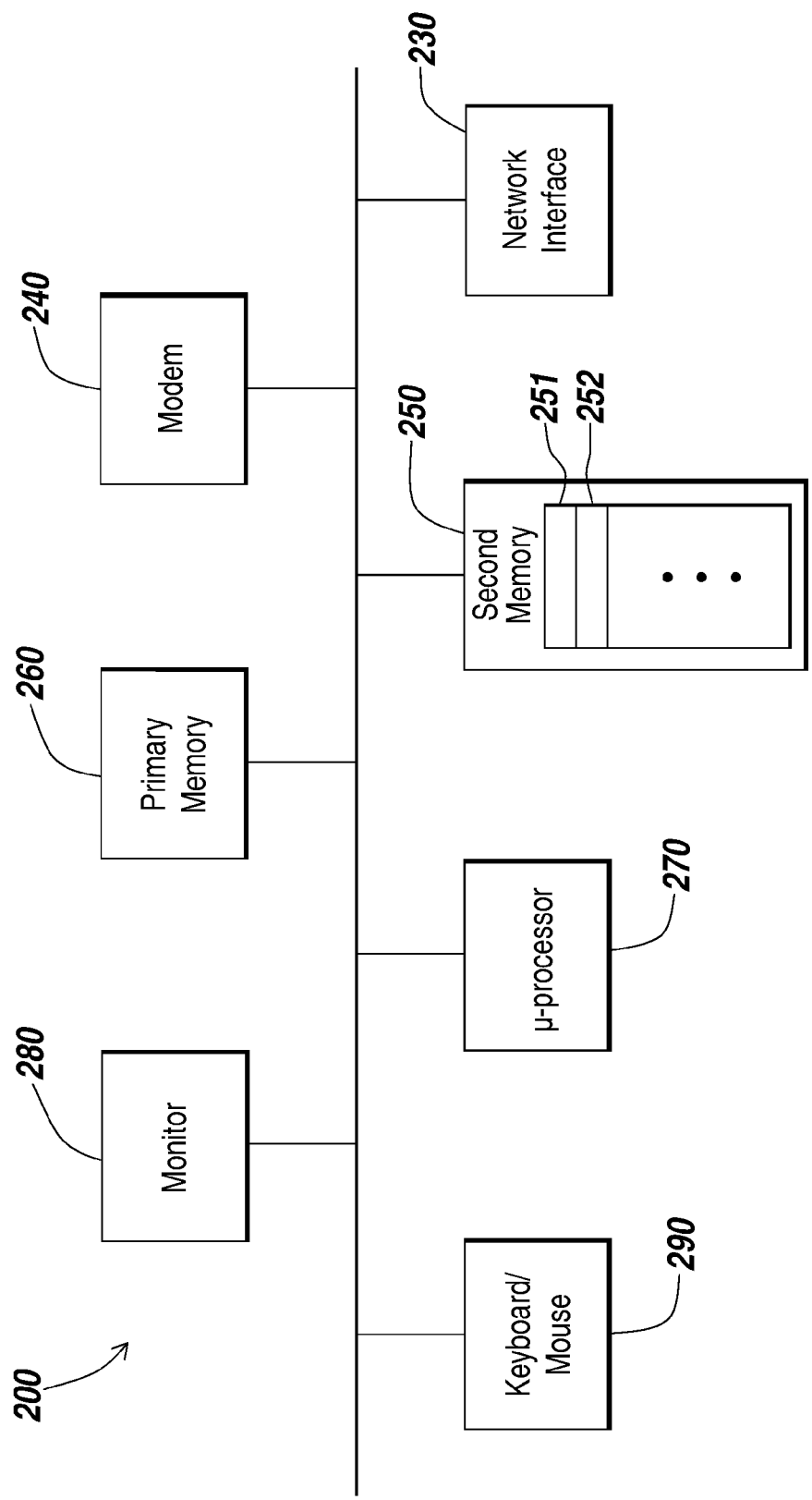
FIG. 2 is a block diagram representation of an electronic device suitable for practicing the illustrative embodiment of the present invention.

FIG. 2 is an exemplary electronic device 200 suitable for practicing the illustrative embodiment of the present invention. One of ordinary skill in the art will appreciate that the electronic device 200 is intended to be illustrative and not limiting of the present invention. The electronic device 200 may take many forms, including but not limited to a workstation, server, network computer, Internet appliance, mobile device, a pager, a tablet computer, and the like. The electronic device 200 includes a network interface 230, a MODEM 240, a secondary memory 250, a primary memory 260, a microprocessor 270, a monitor 280 and a keyboard/mouse 290. The microprocessor 270 controls each component of the electronic device 200 to provide the block diagram modeling environment 100. The electronic device 200 may receive through the keyboard/mouse 290 input data necessary for reporting delay incurred in a model, such as the selection of the component blocks in the model. The electronic device 200 displays in the monitor 280 information on the delay incurred in the block diagram model. The primary memory 260 fetches from the secondary memory 250 and provides to the microprocessor 270 the code that needs to be accessed by the microprocessor 270 to operate the electronic device 200 and to run the modeling environment 100. The secondary memory 250 usually contains software tools for applications. The secondary memory 250 includes, in particular, code 251 for the editor 110 and code 252 for the execution engine 130. The network interface 230 and the MODEM 240 enable the electronic device 200 to communicate with other electronic devices through communication networks, such as Internet, intranet, LAN (Local Area Network), WAN (Wide Area Network) and MAN (Metropolitan Area Network). The communication facilities may support for the distributed implementations of the present invention.

Figure 3:
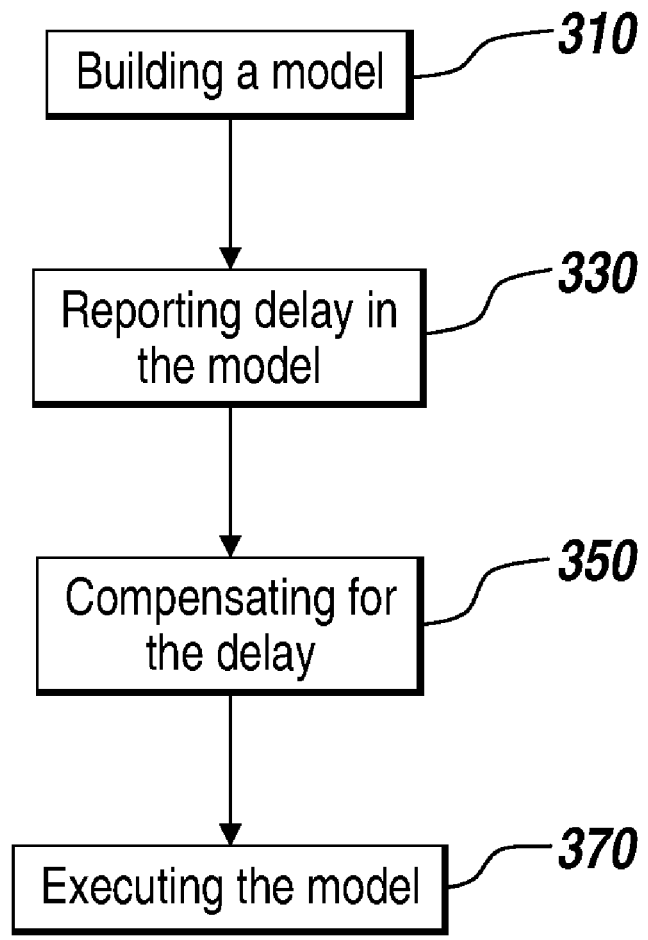
FIG. 3 is a flow chart showing an exemplary operation for reporting delay incurred in a model.
Figure 4:
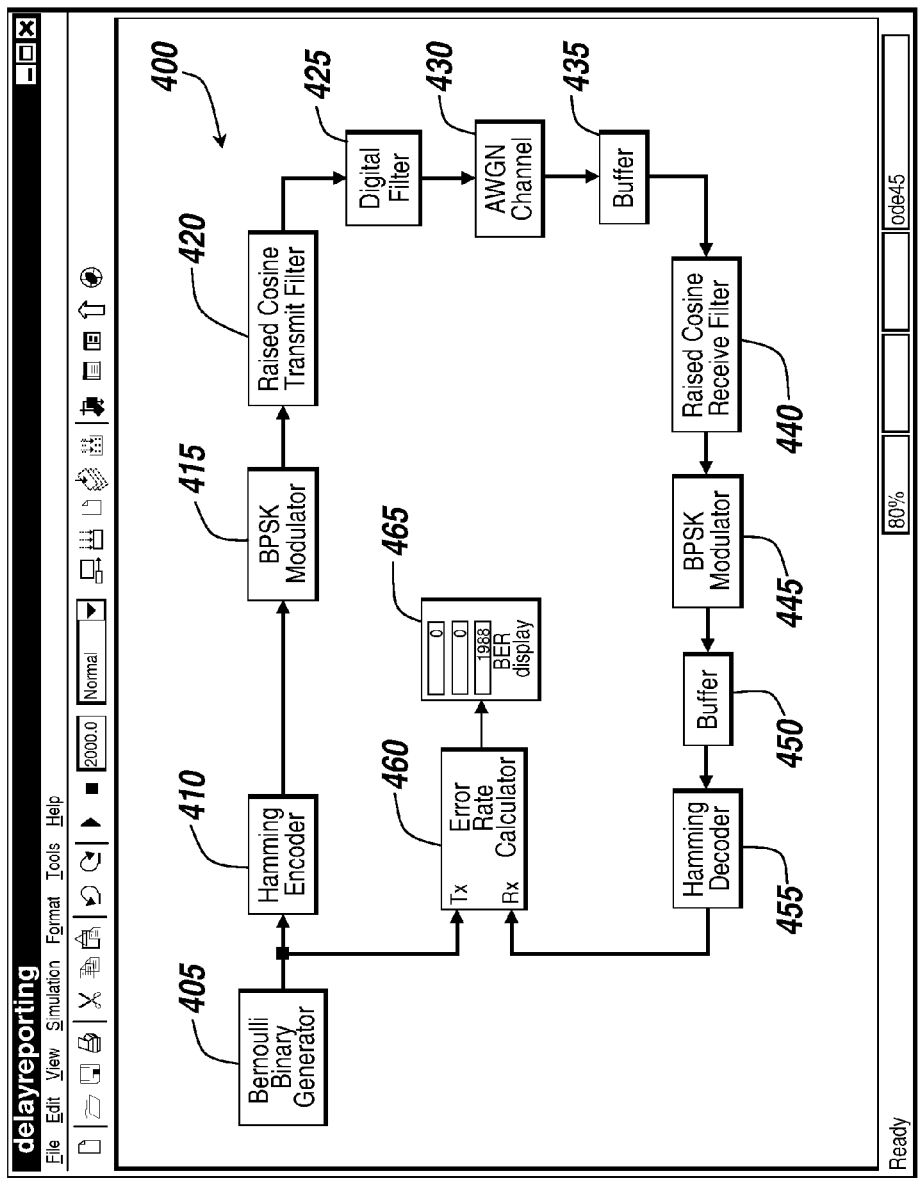
FIG. 4 is an exemplary model implemented in the block diagram modeling environment depicted in FIG. 1.

FIG. 3 is a flow chart showing an exemplary operation of an embodiment of the present invention to report delay incurred in a model. Users may build a block diagram model using the editor 110 (step 310). FIG. 4 is an exemplary model 400 implemented in the illustrative embodiment of the present invention, which relates to a communication system that determines the bit error rate (BER) of the system. The model 400 includes a Bernoulli Binary Generator block 405 that generates random binary number signals using a Bernoulli distribution. The Bernoulli Binary Generator block 405 outputs 4-sample frame signals. The signals from the Bernoulli Binary Generator block 405 are processed through a Hamming Encoder block 410, a BPSK Modulator block 415, a Raised Cosine Transmit Filter block 420, a Digital Filter block 425, an AWGN Channel block 430, a first Buffer block 435, a Raised Cosine Receive Filter block 440, a BPSK Demodulator block 445, a second Buffer block 450 and a Hamming Decoder block 455. An Error Rate Calculator block 460 compares the processed signals with the output of the Bernoulli Binary Generator block 405 to determine the BER of the system, which is displayed in a Display block 465.

The Hamming Encoder block 410 creates a Hamming code with message length K and codeword length N (N=$2^M$−1), where M is an integer greater than or equal to 3, and K equals N-M. The Hamming Encoder block 410 outputs 7-sample frames with no delay. There is no delay in the Hamming Encoder block 410 because the model 400 is using frame-based processing. The BPSK Modulator block 415 modulates input signals using the binary phase shift keying method and outputs a baseband representation of the modulated signals. The BPSK Modulator block 415 incurs no delay and does not change the frame size of the output signals. The Raised Cosine Transmit Filter block 420 upsamples by a factor of 8 to produce 56-sample frames with a 28-sample delay. The Digital Filter block 425 filters each channel of the input signals with a specified digital infinite impulse response (IIR) or finite impulse response (FIR) filter. The Digital Filter block 425 induces a 4-sample delay, but does not change the frame size of the output signals. The AWGN Channel block 430 adds white Gaussian noise to input signals. The AWGN Channel block 430 incurs no delay and does not change the frame size of the output signals. The Buffer blocks re-aggregate the input signals into output signals with a new frame size, larger or smaller than the input frame size. The first Buffer block 435 changes the frame size to 64 samples and induces a 64-sample delay. The Raised Cosine Receive Filter block 440 downsamples by a factor of 8 to produce 8-sample frames with an additional delay of 4 samples at a new rate. The BPSK Demodulator block 445 demodulates input signals that were modulated using the binary phase shift keying method. The BPSK Demodulator block 445 incurs no delay and does not change frame size. The second Buffer block 450 changes the frame size to 7 samples, but incurs no delay. The Hamming Decoder block 455 recovers a binary message vector from a binary Hamming codeword vector. The Hamming Decoder block 455 changes the frame size from 7 samples to 4 samples. The Error Rate Calculation block 460 compares the output of the Hamming Decoder block 455 with the output of the Bernoulli Binary Generator block 405, and calculates the error rate as a running statistic, by dividing the total number of unequal pairs of data elements by the total number of input data elements from one source. The Error Rate Calculation block 460 inherits the sample time of its input signals.

Although the illustrative embodiment is described relative to frame-based signals that include multiple samples in a frame, one of skill in the art will appreciate that the present invention may be applied to systems that deal with other types of signals, such as sample-based signals, bus signals that combine a set of signals into a bus, multi-rate signals and multi-dimensional signals.

Figure 5:
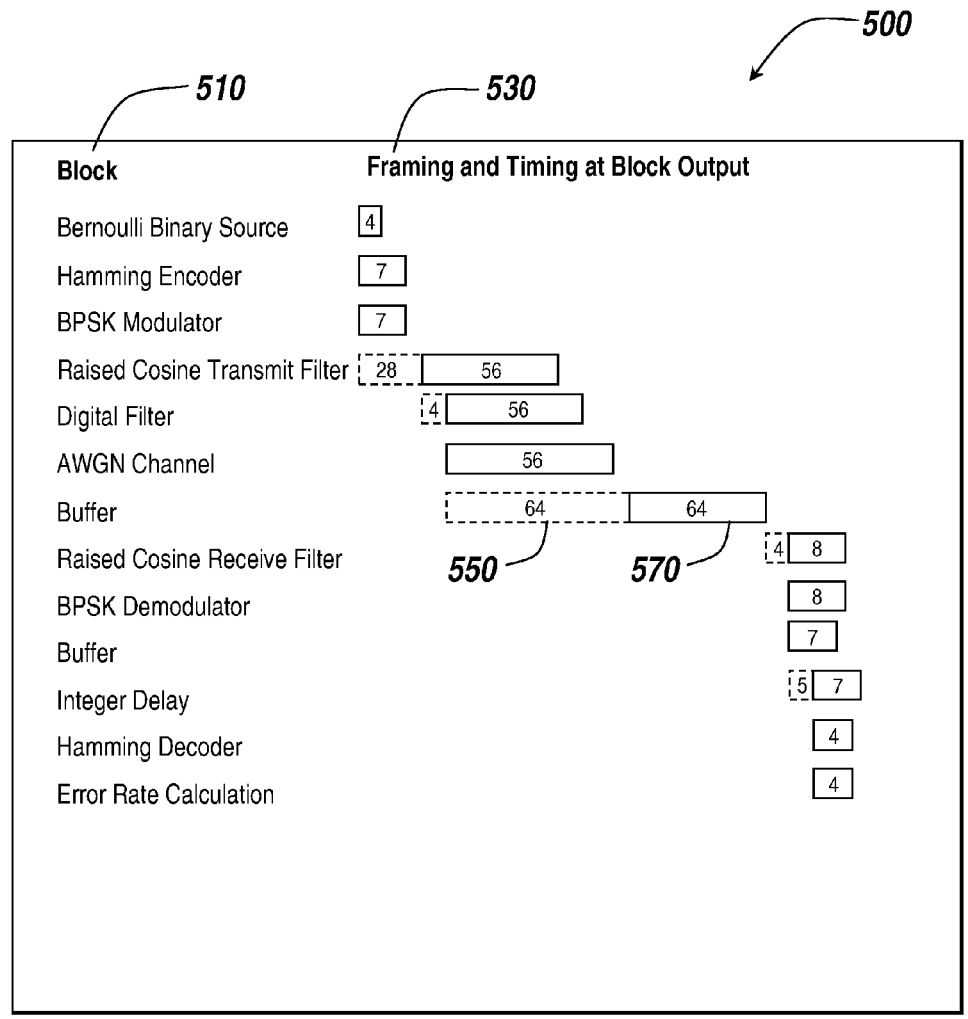
FIG. 5 shows an exemplary Graphical User Interface (GUI) for reporting delay incurred in the model depicted in FIG. 4.
Figure 6:
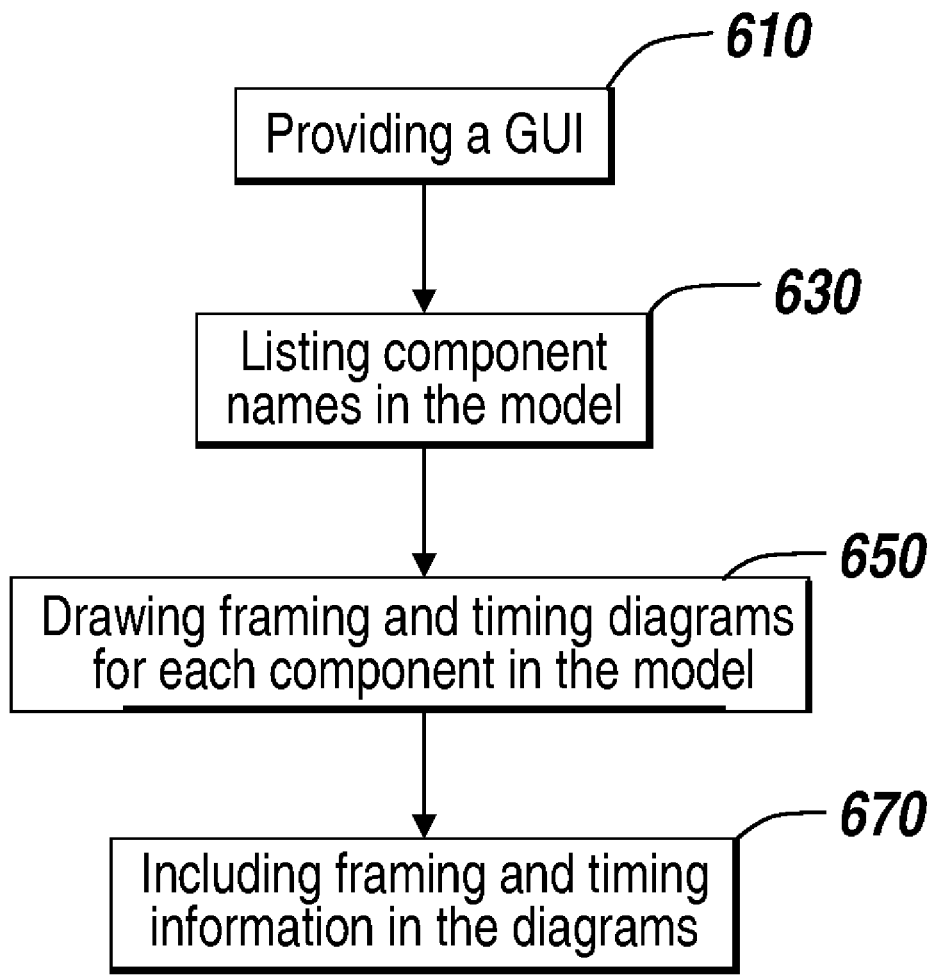
FIG. 6 is a flow chart showing detailed operations for reporting delay incurred in the model depicted in FIG. 4.

The editor 110 may provide an option, for example, in a "Tools" menu that enables the editor 110 to initiate reporting delay incurred in the model 400. If users select the option, the editor 110 automatically calls methods needed for reporting the delay incurred in the model 400 (step 330 in FIG. 3). FIG. 6 is a flow chart showing detailed operations for reporting delay using a graphical user interface (GUI) 500 depicted in FIG. 5. Reporting delay may begin with providing the GUI 500 for displaying a diagram that delivers information on the delay incurred in the model 400 (step 610). The GUI 500 is provided with a list 510 of names that identifies the component blocks included in the model 400 (step 630). The component names may be listed in an order that the signals pass through from the Bernoulli Binary Generator block 405 in the model 400 (such as shown in FIG. 5 in the left hand "Block" column. The signal path may be determined by the execution engine 130 compiling the model 400 as described above with reference to FIG. 1. If the model 400 includes a feedback loop, the illustrative embodiment may consider the feedforward path to determine the signal path of the model 400. The GUI 500 is also provided with the framing and timing diagrams 530 displayed in connection with each of the block names listed in the GUI 500 (step 650). In the framing and timing diagrams 530, each of the blocks listed in the GUI 500 is provided with the framing and timing information of the block (step 670). The rectangles with dotted boundaries 550 show the delay incurred in the blocks. The rectangles with solid boundaries 570 show the frame size of the output signals in the blocks. For example, the first Buffer block 435 induces a 64-sample delay and changes output signals to 64 sample frame signals. The delay may be accumulated by adding dotted boundaries from left to right in the framing and timing diagram 530.

Although bar charts are employed to display the framing and timing of the model 400 in the illustrative embodiment, one of skill in the art will appreciate any variations of the bar charts may be employed for displaying the framing and timing of the model 400. One of skill in the art will also appreciate that different colors may be used to indicate the delay and the size of output frames in the framing and timing diagram of the model 400.

For the models of multi-rate systems, the GUI 500 may provide the framing and timing diagram 530 with multi-levels in a hierarchical tree. Each level of the tree corresponds to a chain of blocks that operate at a particular rate. In the above example, the Bernoulli Binary Generator block 405, the Hamming Encoder block 410, the BPSK Modulator block 415, the second Buffer block 450, the Hamming Decoder block 455, and the Error Rate Calculation block 460 operate at a same primary rate, and the framing and timing diagrams for these blocks are displayed in a same level. On the other hand, the Raised Cosine Transmit and Receive Filter blocks 420 and 440, the Digital Filter block 425, the AWGN Channel block 430, and the first Buffer block 435 operate at an upsampled rate, and the framing and timing diagrams of these blocks may be provided in a different level.

The model 400 may include conditionally executed blocks, such as the Input Switch, Enabled Subsystem, Triggered Subsystem, and Function Call Subsystem provided in Simulink®. The conditionally executed blocks execute on a given condition. For example, the Enabled Subsystem, Triggered Subsystem, and Function Call are not executed at all unless a control signal for each block (the enable signal, trigger signal and function call) has the right characteristics. The Input Switch includes multiple input signals and chooses one of the input signals based on a given condition. The blocks that process the switched-off signal do not execute. If the model 400 includes conditionally executed blocks, the reporting mechanism of the illustrative embodiment may display the delay of the model 400 for each possible execution condition. For example, if the model 400 contains Enabled Subsystem, the delay reporting mechanism may provide two displays, such as the framing and timing diagram depicted in FIG. 5, to show the delay profile with the Enabled Subsystem off, and with the Enabled Subsystem on. Alternatively, the delay reporting mechanism may report both sets of delays in one display, but highlight the portion of the display that represents the delays caused by the Enabled Subsystem.

The delay of each block in the model 400 is determined by the algorithm of the block that is used to produce its output in response to its input. The information on the algorithm of each block may be contained in the block as intrinsic information of the block, such as the attributes and parameters of the block. The delay may be constant for many blocks. Many other blocks may have deterministic delay based on block attributes and parameters. If such information is not known intrinsically by the block, the block may run a small simulation to determine the delay incurred in the block. For example, in the case of an analog or digital filter, the filter's impulse response is known prior to model run time, and the impulse response may be used to generate an accurate estimate of the filter's delay.

In the illustrative embodiment, the delay information is expressed in terms of samples. One of skill in the art will appreciate that the delay may be represented in terms of other quantities, such as time and frames. The representation of delay in terms of time is advantageous for continuous time systems, such as those dealing with fluid flow, atmospheric pressure, external temperatures, or motor torque. The representation of delay in terms of frames is useful when the signals in the model 400 are a packet-based signal, such as a TCP/IP packet.

Figure 7:
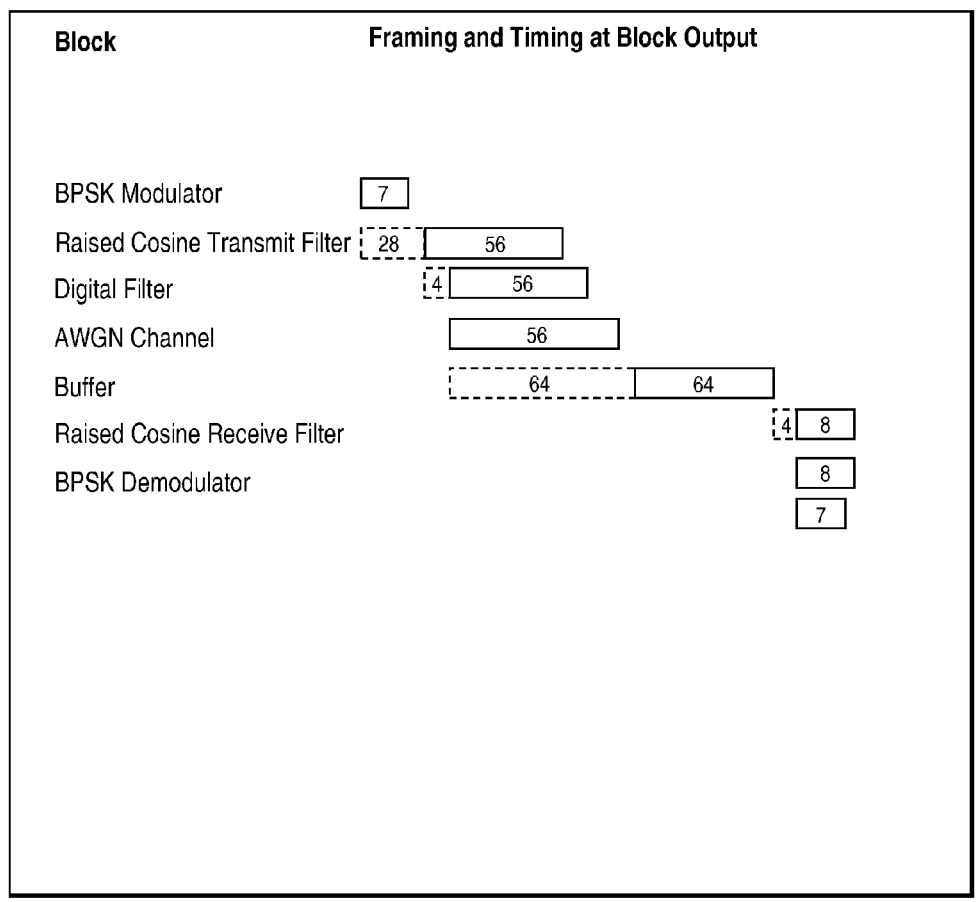
FIG. 7 shows another exemplary GUI for reporting delay incurred in the selected blocks of the model depicted in FIG. 4.

Although the GUI 500 displays the framing and timing information of all of the components blocks included in the model 400 in FIG. 5, the GUI 500 may display the framing and timing information on limited component blocks selected by users. For example, if the users select the BPSK Modulator block 415 and the BPSK Demodulator block 445, the GUI 500 may display the framing and timing information of the BPSK Modulator block 415 and the BPSK Demodulator block 445, or all of the component blocks between the BPSK Modulator block 415 and the BPSK Demodulator block 445 on the signal path of the model 400, as depicted in FIG. 7.

Figure 8:
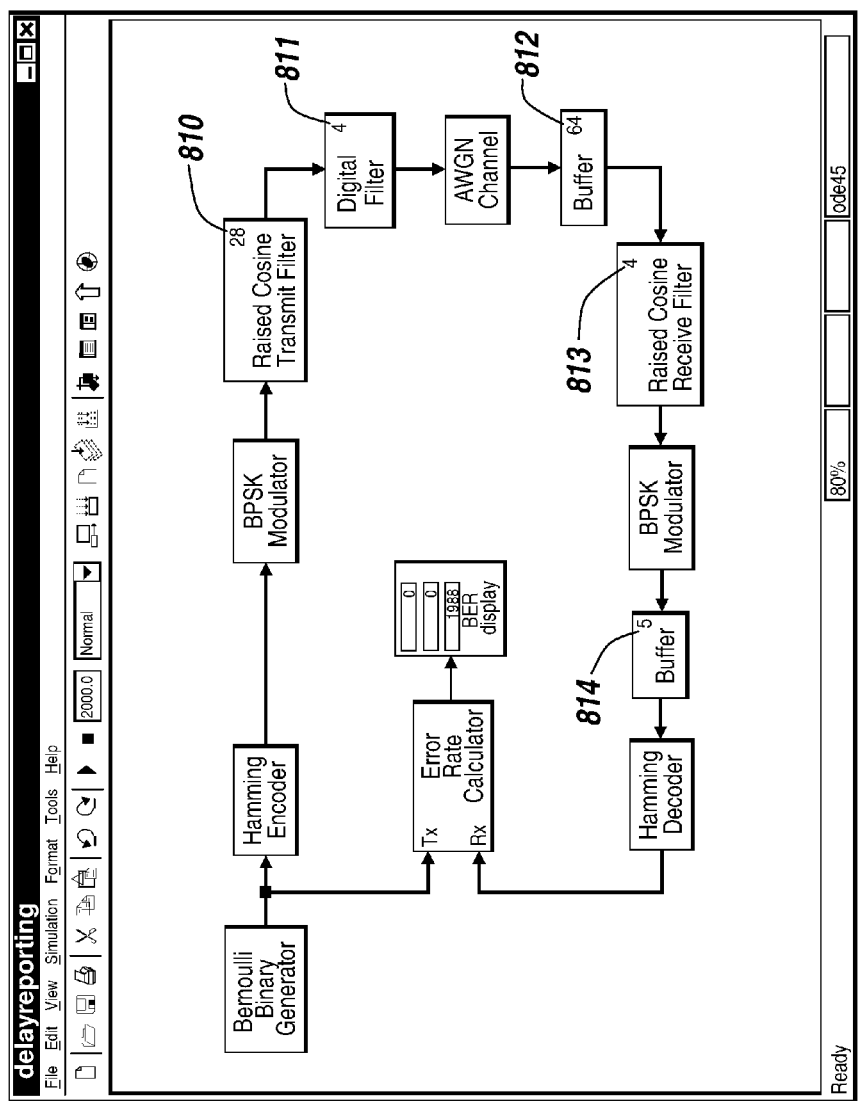
FIG. 8 is a block diagram representation of the model depicted in FIG. 4 in which information on the delay incurred in component blocks is displayed in connection with the representation of the component blocks.

Alternatively, delay may be displayed on the block diagram representation of the model 400, as depicted in FIG. 8, as well as in a separate window. The information on the delay incurred in the model 400 is displayed in connection with the representation of the blocks that incur the delay. The blocks that incur the delay, such as the Raised Cosine Transmit Filter block 420, the Digital Filter block 425, the first Buffer block 435, the Raised Cosine Receive Filter block 440 and the second Buffer block 450, include sample numbers 810-814 within the blocks that represent the delay incurred in each of the blocks.

After the delay incurred in the model is calculated, the delay may be compensated for, based on the calculated amount of the delay (step 350 in FIG. 3). Because systems with delay compensation must be causal, the signals delayed in the model cannot be advanced. Instead, the illustrative embodiment of the present invention inserts one or more compensation components that incur additional delay for compensating for the delay incurred in the model. The additional delay is added such that the frame boundaries of signals are preserved. That is, if any existing blocks in the model incur delay, a further delay is added such that total delay is an integer number of frames.

Figure 9A:
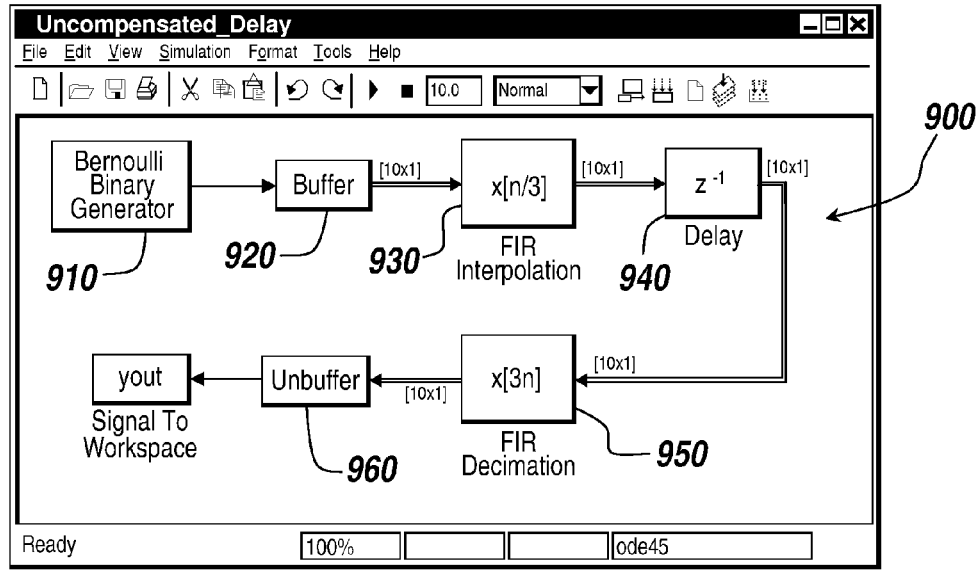
FIG. 9A depicts an exemplary model to illustrate model-wide delay compensation.

The illustrative embodiment of the present invention provides a model-wide delay compensation option as well as a block-by-block delay compensation option. FIG. 9A depicts an exemplary model 900 to illustrate model-wide delay compensation. The model 900 includes a Bernoulli Binary Generator block 910, a Buffer block 920, an FIR Interpolation block 930, a Delay block 940, an FIR Decimation block 950 and an Unbuffer block 960. The model 900 is a multi-rate system because the FIR Interpolation block 930 samples the discrete-time input at a rate L times faster than the input sample rate, where the integer L is specified by an interpolation factor parameter, and the FIR Decimation block 950 samples discrete-time input signals at a rate K times slower than the input sample rate, where the integer K is specified by a decimation factor parameter. The FIR Interpolation block 930 and the FIR Decimation block 950 are duals of each other in the model 900. Delay incurs at the delay block 940, which operates at a high rate and the delay should be compensated for at the high rate, that is, prior to the FIR Decimation block 950. If delay is incurred in multiple blocks that operate at multiple rates, the numerical delay on these blocks cannot simply be added together to determine the end-to-end delay of the model.

In order to compensate for the delay, users may right click on the "white space" of the model 900 to bring up a menu for model-wide options that may include a model-wide delay compensation option. The users may also click on a "Tools" menu in the menu bar to bring up the model-wide delay compensation option. If the users select the model-wide delay compensation option, a user interface, such as depicted in FIG. 9B, is provided for the users to set up the parameters of the model-wide delay compensation option. In the graphical user interface depicted in FIG. 9B, the users may be provided with a query 970 whether the users want automatic compensation or to confirm the addition of each new compensation block for each delay component in the model. The users may also be provided with an option 980 to select the color of additional delay blocks in order to differentiate them from delay blocks already present in the model.

Figure 9C:
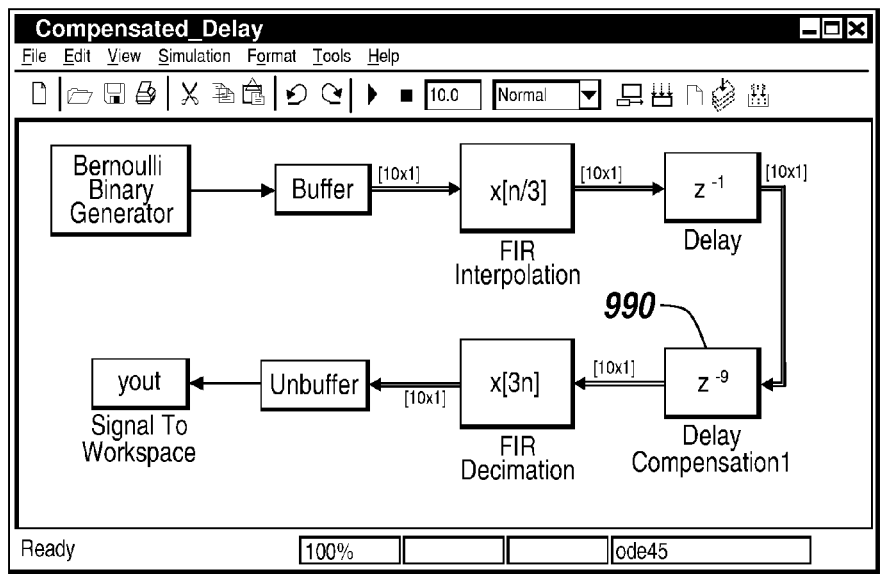
FIG. 9C shows an exemplary compensation component automatically inserted into the model.
Figure 9B:
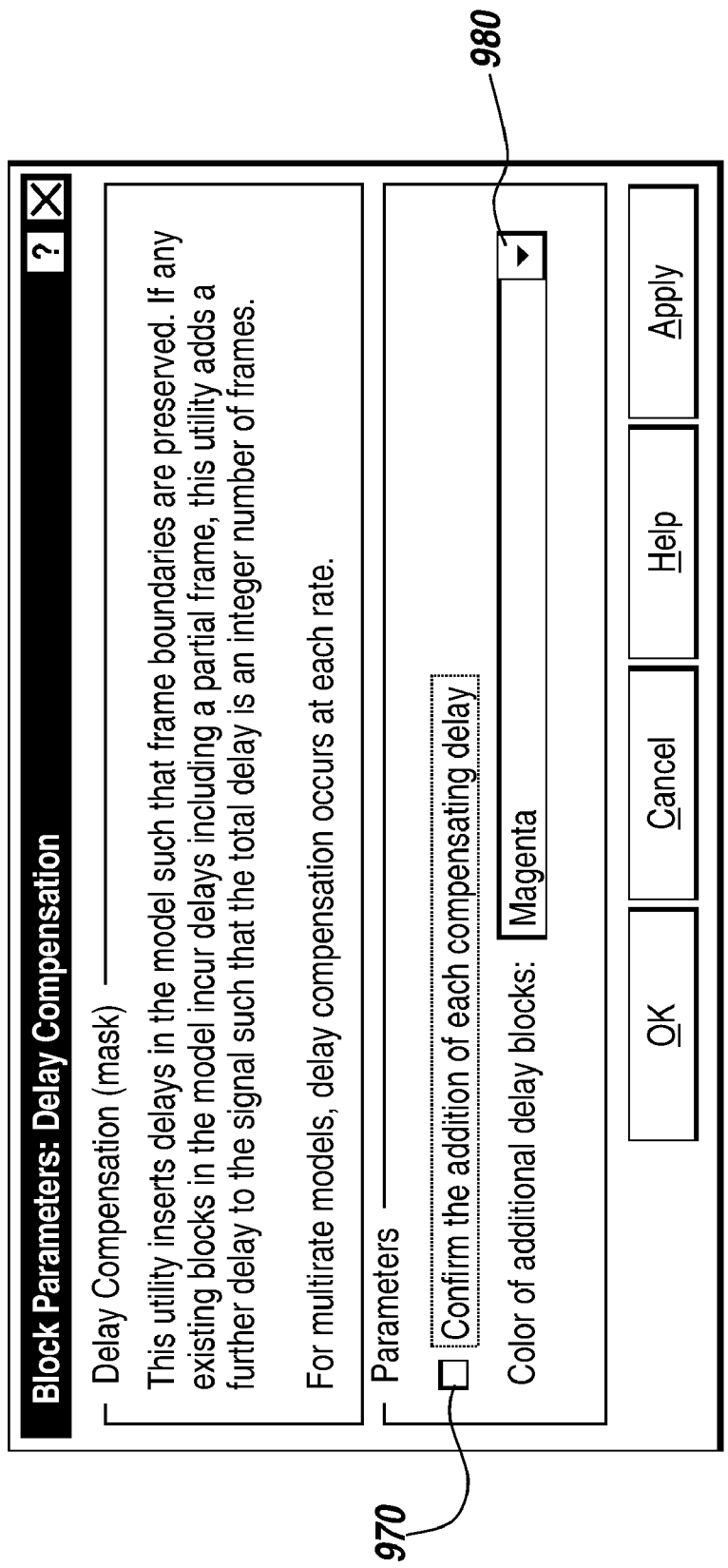
FIG. 9B shows an exemplary user interface provided for the users to set up the parameters of the model-wide delay compensation option.

If the users select automatic delay compensation, a compensation component, such as a Delay block 990, is automatically inserted into the model 900, as shown in FIG. 9C. For a multi-rate system, different compensation blocks may be inserted to compensate for delay incurred at each rate. As described above, the model 900 has delay at an interpolated (i.e. high) rate and the delay compensation component 990 is added at the high rate prior to the FIR Decimation block 950. If the model includes multiple blocks that incur delay at the high rate, the automatic compensation may cascade the delay of the multiple blocks and insert a single compensation component to account for all of the delay at the high rate. If the model 900 includes a block or blocks that incur delay at a low rate, a separate compensation block may be inserted to compensate for the delay at the low rate.

The compensation component 990 adds delay to the model 900 such that the frame boundaries of signals are preserved. The compensation component 990 may be colored as designated in the user interface depicted in FIG. 9B. The delay amount of the compensation component 990 is determined based on the delay incurred in the model 900. For example, if the signals are a frame-based signal with a frame length of 10 samples, the signals pass through the delay block 940 that induces a delay of 1 sample. Thus, the Compensation Delay block 990 induces a further signal delay of 9 samples, thus yielding a 10-sample, or 1-frame, delay.

Figure 10A:
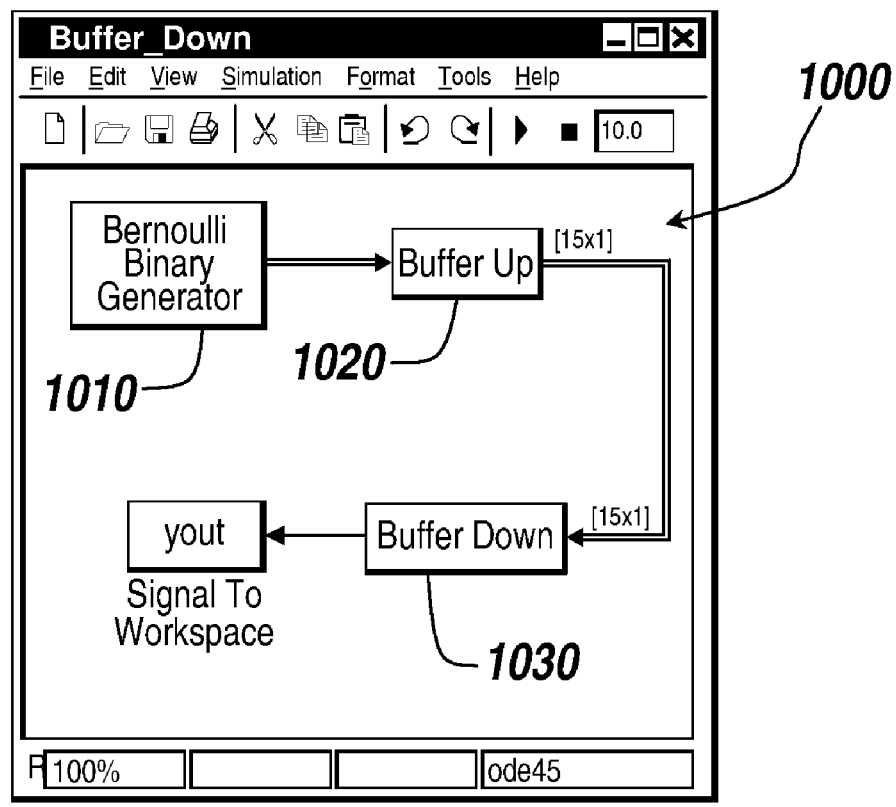
FIG. 10A is an exemplary model to illustrate the block-by-block delay compensation option.

The illustrative embodiment of the present invention may provide a block-by-block delay compensation option. This compensation option may be useful when the operation of a model is done in pairs, such as modulators and demodulators, encoders and decoders, etc., which is very prevalent in a communication system. FIG. 10A depicts an exemplary model 1000 to illustrate the block-by-block delay compensation option. The model 1000 includes a Bernoulli Binary Generator block 1010, a Buffer Up block 1020 and Buffer Down block 1030. It is assumed that the Buffer Up and Buffer Down blocks 1020 and 1030 operate at the same rate. The Buffer Up block 920 and Buffer Down block 1030 may be defined as a pair of blocks. For example, the Buffer Up block 920 may receive frames of size 10 samples, and output frames of 15 samples with a 15-sample delay. The Buffer Down block 1030 may receive frames of size 15 samples, and output frames of 10 samples with no delay. FIG. 10B depicts the frame timing diagram of the model 1000 without compensation. In the frame timing diagram, the beginning of the frame at the output of the Buffer Down block 1030 is in the middle of the frame relative to the output of the Bernoulli Binary Generator block 1010.

Figure 10C:
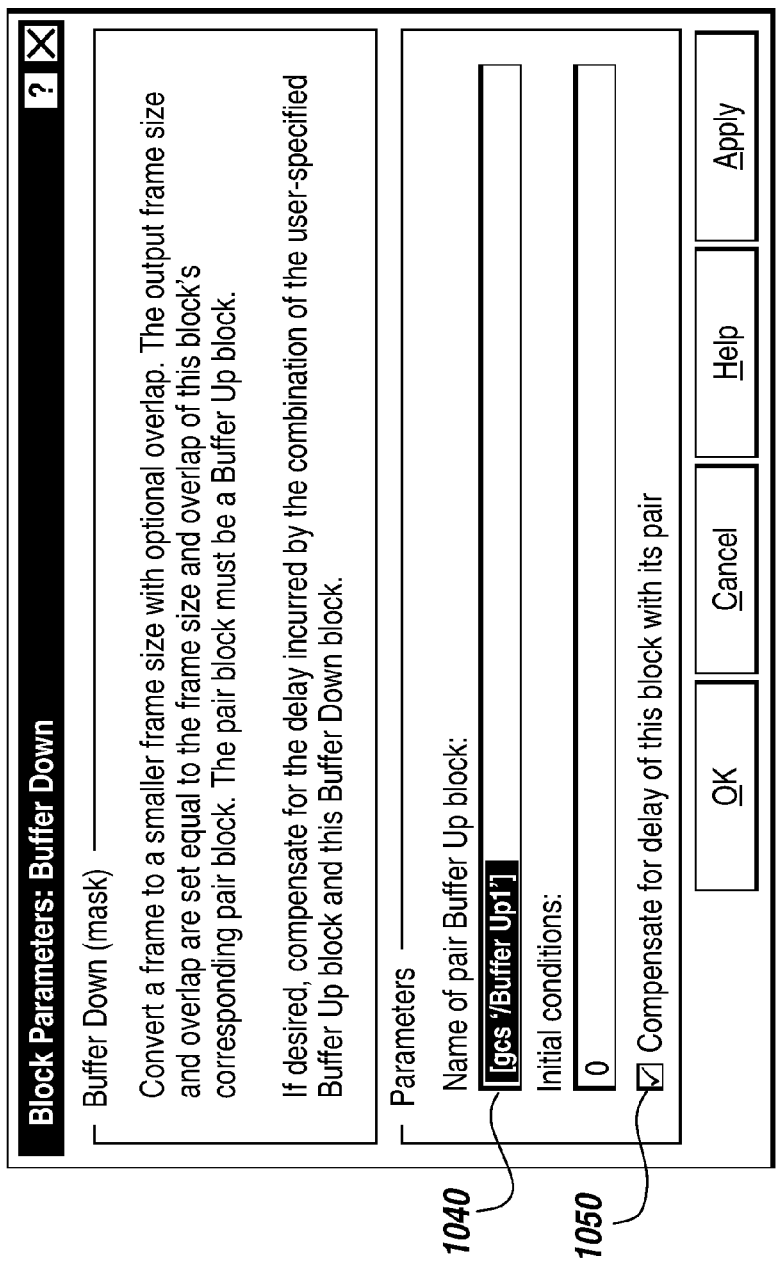
FIG. 10C shows an exemplary mask dialog of the Buffer Down block, the second half of the pair of blocks.

The users may click on a "Tools" menu in the menu bar to bring up the block-block delay compensation option. If the users select the block-by-block compensation option, the "second half" of a pair of blocks may include an option by which the cumulative delay of the pair of blocks is compensated for. FIG. 10C depicts an exemplary mask dialog of the Buffer Down block 1030, the second half of the pair of blocks. The mask dialog provides parameters for setting the block-block delay compensation function for compensating for the delay incurred in the Buffer Up block 1020 the Buffer Down block 1030. The parameters may include an option 1040 to designate the name of the pair Buffer Up block 1020 and an option 1050 to select compensation for delay incurred by the pair of blocks. If the option 1050 is selected, the delay of the model 1000 is compensated for with the result of the frame timing changes as depicted in FIG. 10D. In the compensated frame timing, the Buffer Down block 1030 introduces a 5 sample delay such that the frames out of the Bernoulli Binary Generator block 1010 and the Buffer Down block 1030 are aligned. In the illustrative embodiment, the 5 sample delay may be colored to indicate that it is inserted by a delay compensation mechanism. In a multi-rate system, the Buffer Down block 1030 should operate at the same or higher rate than the Buffer Up block 1020 to compensate for the delay incurred in the Buffer Up block 1020. If the Buffer Up block 1030 operates at a higher rate and induces 1 sample delay, the Buffer Down block 1030 cannot compensate for the delay if the Buffer Down block 1030 operates at a lower rate than the Buffer Up block 1020.

After the delay is properly compensated for, the model 900 may be executed by the execution engine 310 as described above with reference to FIG. 1 (step 370 in FIG. 3). The reporting of algorithmic delay in the illustrative embodiment may also be applied to reporting actual execution or computational delays incurred in executing the model 900 in a targeted piece of hardware. In reporting the execution or computational delay, the delay may be shown in terms of time, and the delay may represent the time of execution for each block in the model 900 by the targeted hardware.

In summary, the illustrative embodiment of the present invention provides tools for reporting delay incurred in a model 400. The model 400 is implemented using a block diagram modeling tool in the illustrative embodiment, but the model 400 may be implemented in other modeling environments. The delay incurred in the model 400 may be displayed in a user interface element that provides information on the timing of the component blocks in the model 400. The user interface element may provide the timing information of selected component blocks in the model 400 so that users may be able to analyze a part of the model 400 instead of the whole model 400. The delay information may also be provided to users within the block diagram representation of the model 400. The illustrative embodiment of the present invention further provides automatic compensation for the delay. By reporting the delay incurred in the model 400 prior to the execution of the model 400, the illustrative embodiment enables the users to compensate for the delay without executing the model 400.

It will thus be seen that the invention attains the objectives stated in the previous description. Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any other modeling environments including textual and graphical modeling environments, such as a state-based modeling environment. Practitioners of the art will realize that the sequence of steps and architectures depicted in the figures may be altered without departing from the scope of the present invention and that the illustrations contained herein are singular examples of a multitude of possible depictions of the present invention.

We claim:

1. A non-transitory computer-readable medium storing computer-executable instructions executable by a processor, the medium storing one or more instructions for:
   determining a delay incurred in a first component in a model, the first component operating at a first rate in the model;
   determining a delay incurred in a second component in the model, the second component operating at a second rate in the model, the second rate being different than the first rate;
   adding a first rate compensation component to the model that compensates for a delay incurred at the first rate; and
   adding a second rate compensation component to the model that compensates for a delay incurred at the second rate.

2. The medium of claim 1, further comprising:
providing information about the determined delay incurred in the first component in the model and information about the determined delay incurred in the second component in the model by displaying the information about the determined delay incurred in the first component in the model and the information about the determined delay incurred in the second component in the model in a diagram.

3. The medium of claim 2 wherein the diagram contains multiple levels and wherein the information about the determined delay incurred in the first component in the model is provided at a first level in the diagram and the information about the determined delay incurred in the second component in the model is provided at a second level in the diagram, and wherein the first level is different than the second level.

4. The medium of claim 2 wherein the diagram shows the information about the determined delay incurred in the first component in the model and the information about the determined delay incurred in the second component in the model in an order that is based at least on an order of execution of the first component and the second component.

5. The medium of claim 2 wherein at least one of the information about the determined delay incurred in the first component in the model or the information about the determined delay incurred in the second component in the model is expressed in terms of at least one of time, samples, or frames.

6. The medium of claim 1 wherein the delay incurred in the first component is determined based on at least an algorithm of the first component that is used to produce an output of the first component based at least on an input of the first component.

7. The medium of claim 1 wherein the delay incurred in the first component is determined based on at least one of:
one or more attributes of the second component, or
one or more parameters of the second component.

8. The medium of claim 1 wherein the delay incurred in the second component is determined based on at least an algorithm of the second component that is used to produce an output of the second component based at least on an input of the second component.

9. The medium of claim 1 wherein the delay incurred in the second component is determined by at least one of:
one or more attributes of the second component, or
one or more parameters of the second component.

10. The medium of claim 1, wherein the delay incurred in the first component is expressed in terms of frames having frame boundaries, and the first rate compensation component preserves the frame boundaries.

11. The medium of claim 1, wherein the first rate is higher than the second rate, the medium further storing instructions for identifying a third component in the model, the third component operating at the first rate,
wherein the first rate compensation component cascades the delay incurred in the first component and a delay incurred in the third component to account for a combined delay at the first rate.

12. A method comprising:
determining a delay incurred in a first component in a model, the first component operating at a first rate in the model;
determining a delay incurred in a second component in the model, the second component operating at a second rate in the model, the second rate being different than the first rate;
interacting with a first rate compensation component that compensates for a delay incurred at the first rate; and
interacting with a second rate compensation component that compensates for a delay incurred at the second rate.

13. The method of claim 12, further comprising providing information about the determined delay incurred in the first component in the model and information about the determined delay incurred in the second component in the model, wherein the information about the determined delay incurred in the first component in the model and the information about the determined delay incurred in the second component in the model are provided in a diagram.

14. The method of claim 13 wherein the information about the determined delay incurred in the first component in the model and the information about the determined delay incurred in the second component in the model is provided by being displayed in at least one of a block diagram of the model or a separate window.

15. The method of claim 12, wherein the delay incurred by the first component or the delay incurred by the second component is an algorithmic delay, the method further comprising:
providing the determined algorithmic delay of the first component or the second component prior to executing the model.

16. The method of claim 15 wherein the algorithmic delay is determined from intrinsic information associated with the first component or the second component.

17. The method of claim 16 wherein the intrinsic information includes at least one of:
one or more attributes associated with the first component or the second component, or
one or more parameters associated with the first component or the second component.

18. The method of claim 15 wherein the algorithmic delay is determined by simulating the first component or the second component.

19. The method of claim 15 wherein providing the determined algorithmic delay further comprises:
displaying the determined algorithmic delay.

20. A system comprising:
a main memory;
a program of executable instructions stored in said main memory;
a processor coupled to said main memory to execute the instructions stored in said main memory to perform the following method steps of;
determining a delay incurred in a first component in a model, the first component operating at a first rate in the model;
determining a delay incurred in a second component in the model, the second component operating at a second rate in the model, the second rate being different than the first rate;
compensating for a delay incurred at the first rate using a first rate compensation component; and
compensating for a delay incurred at the second rate using a second rate compensation component.

* * * * *